US010474036B2

(12) United States Patent
Paul et al.

(10) Patent No.: US 10,474,036 B2
(45) Date of Patent: Nov. 12, 2019

(54) OPTICAL ELEMENT AND OPTICAL ARRANGEMENT THEREWITH

(71) Applicant: Carl Zeiss SMT GmbH, Oberkochen (DE)

(72) Inventors: Hans-Jochen Paul, Aalen (DE); Boris Bittner, Roth (DE); Norbert Wabra, Werneck (DE); Thomas Schicketanz, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 107 days.

(21) Appl. No.: 15/257,349

(22) Filed: Sep. 6, 2016

(65) Prior Publication Data

US 2016/0377988 A1    Dec. 29, 2016

Related U.S. Application Data

(63) Continuation of application No. PCT/EP2015/054295, filed on Mar. 2, 2015.

(30) Foreign Application Priority Data

Mar. 6, 2014   (DE) ........................ 10 2014 204 171

(51) Int. Cl.
*G03F 7/20*  (2006.01)
*G02B 27/00*  (2006.01)
(Continued)

(52) U.S. Cl.
CPC ....... *G03F 7/70225* (2013.01); *G02B 5/0833* (2013.01); *G02B 5/0891* (2013.01);
(Continued)

(58) Field of Classification Search
CPC ........ G02B 1/115; G02B 1/105; G02B 13/14; G02B 13/143; G02B 5/20; G02B 5/208;
(Continued)

(56) References Cited

U.S. PATENT DOCUMENTS 5,153,898 A    10/1992  Suzuki et al.
5,390,228 A    2/1995   Masahito et al.
(Continued)

FOREIGN PATENT DOCUMENTS

CN    102132214 A    7/2011
EP    0532236 A1    3/1993
(Continued)

OTHER PUBLICATIONS

International Search Report and Written Opinion in counterpart International Application No. PCT/EP2015/054295, dated Jun. 5, 2015, 10 pages.
(Continued)

*Primary Examiner* — Jie Lei
(74) *Attorney, Agent, or Firm* — Edell, Shapiro & Finnan, LLC

(57) ABSTRACT

An optical arrangement includes an optical element (1) and a thermal manipulation device. The optical element has a substrate (2), a coating (3, 9, 5) applied to the substrate (2), and an antireflection coating (3). The coating (3, 9, 5) includes: a reflective multi-layer coating (5b) configured to reflect radiation (4) with a used wavelength ($\lambda_{EUV}$). The antireflection coating (3) is arranged between the substrate (2) and the reflective multi-layer coating (5b) to suppress reflection of heating radiation (7) with a heating wavelength ($\lambda_H$) that differs from the used wavelength ($\lambda_{EUV}$). The thermal manipulation device has at least one heating light source (8) to produce heating radiation (7).

24 Claims, 9 Drawing Sheets

(51) Int. Cl.
*G21K 1/06* (2006.01)
*G02B 5/08* (2006.01)
*G02B 5/20* (2006.01)

(52) U.S. Cl.
CPC ............ *G02B 5/208* (2013.01); *G02B 27/005* (2013.01); *G03F 7/70266* (2013.01); *G03F 7/70316* (2013.01); *G03F 7/70891* (2013.01); *G03F 7/70958* (2013.01); *G21K 1/062* (2013.01)

(58) Field of Classification Search
CPC ........ G02B 5/285; G02B 5/08; G02B 5/0891; G02B 5/0833; G02B 27/00; G02B 27/005; G03F 7/20; G03F 7/70225; G03F 7/70766; G03F 7/70958; G03F 7/70891; G03F 7/70316; G03F 7/70266; G21K 1/06; G21K 1/062
USPC ....... 359/355, 356, 361, 359, 360, 586, 589, 359/884
See application file for complete search history.

(56) References Cited

U.S. PATENT DOCUMENTS

| | | | |
|---|---|---|---|
| 6,466,382 | B2 | 10/2002 | Mueller-Rissmann et al. |
| 6,665,126 | B2 | 12/2003 | Shafer et al. |
| 7,385,756 | B2 | 6/2008 | Shafer et al. |
| 7,619,827 | B2 | 11/2009 | Omura et al. |
| 8,111,378 | B2 | 2/2012 | Uchikawa |
| 8,665,420 | B2 | 3/2014 | Van Herpen et al. |
| 9,316,929 | B2 | 4/2016 | Baer et al. |
| 9,348,234 | B2 | 5/2016 | Bittner et al. |
| 9,372,411 | B2 | 6/2016 | Zellner et al. |
| 9,442,397 | B2 | 9/2016 | Hauf |
| 2003/0169520 | A1 | 9/2003 | Goldstein |
| 2006/0145094 | A1 | 7/2006 | Van Herpen et al. |
| 2008/0024867 | A1 | 1/2008 | Kawashima et al. |
| 2008/0246933 | A1 | 10/2008 | Uchikawa |
| 2011/0149262 | A1 | 6/2011 | Van Herpen et al. |
| 2012/0034558 | A1 | 2/2012 | Chang |
| 2012/0069310 | A1 | 3/2012 | Bleidistel et al. |
| 2013/0010275 | A1 | 1/2013 | Medvedev et al. |
| 2013/0213932 | A1 | 8/2013 | Umezawa |

FOREIGN PATENT DOCUMENTS

| | | |
|---|---|---|
| EP | 1113336 A | 7/2001 |
| EP | 1197776 A | 4/2002 |
| JP | 63312640 A | 12/1988 |
| JP | H06177003 A | 6/1994 |
| JP | 2005019628 A | 1/2005 |
| JP | 2006235595 A | 9/2006 |
| JP | 2007317847 A | 12/2007 |
| JP | 2010272677 A | 12/2010 |
| JP | 2012501073 A | 1/2012 |
| JP | 2012527099 A | 1/2012 |
| JP | 2013538433 A | 10/2013 |
| WO | 2004019128 A2 | 3/2004 |
| WO | 2005069055 A2 | 7/2005 |
| WO | 2009046955 A2 | 4/2009 |
| WO | 2009152959 A1 | 12/2009 |
| WO | 2012013747 A1 | 2/2012 |
| WO | 2013044936 A1 | 4/2013 |
| WO | 2014139543 A | 9/2014 |

OTHER PUBLICATIONS

Office Action in corresponding German Application 102014204171.6, dated Oct. 20, 2014, along with English Translation.
Office Action in corresponding Chinese Application 201580011909.X, dated Jun. 14, 2018, along with English Translation.
JP Office Action with English translation, Patent Application No. 2016-555708, dated Nov. 11, 2018, 8 pages.
TW Office Action with English translation, TW104106971, dated Nov. 12, 2018, 14 pages.
Search Report of TW Application 104106971, dated Nov. 8, 2018, 2 pages.
Japanese Office Action with English translation, JP2016-555708, dated Jul. 3, 2019, 10 pages.
Chinese Office Action with English translation, CN201580011909.X, dated Feb. 26, 2019, 12 pages.

OPTICAL ELEMENT AND OPTICAL ARRANGEMENT THEREWITH

CROSS-REFERENCE TO RELATED APPLICATIONS

This is a Continuation of International Application PCT/EP2015/054295, which has an international filing date of Mar. 2, 2015, and the disclosure of which is incorporated in its entirety into the present Continuation by reference. The following disclosure is also based on and claims the benefit of and priority under 35 U.S.C. § 119(a) to German Patent Application No. DE 10 2014 204 171.6, filed Mar. 6, 2014, which is also incorporated in its entirety into the present Continuation by reference.

FIELD OF THE INVENTION

The invention relates to an optical element and an optical arrangement comprising at least one such optical element.

BACKGROUND

The practice of using so-called wavefront manipulators for correcting aberrations, e.g. in microlithographic projection lenses, is known. Such manipulators typically produce the wavefront correction by mechanical manipulation, for example by changing the position and/or producing a deformation of the element serving as a manipulator. However, mechanical manipulators typically can only correct low-order wavefront errors, while higher-order wavefront errors, as may be caused by a high thermal load on the optical elements, generally cannot be compensated sufficiently by mechanical manipulators. Therefore, for correcting higher-order wavefront errors, thermal actuators are used so as to change the optical properties of optical elements by a targeted, generally spatially resolved thermal manipulation.

For correcting an imaging property of a projection system in a projection exposure apparatus for the VUV wavelength range, U.S. Pat. No. 8,111,378 B2 proposes the application of radiation in a wavelength range which differs from a wavelength range of an exposure beam of the projection exposure apparatus to at least part of an optical element, typically a lens element, by way of a spatial waveguide mechanism.

WO 2012/013747 A1 discloses the practice of controlling the spatially dependent temperature distribution in a substrate of a reflective optical element with the aid of a heat-controlling device in two or three spatial directions. The heat-controlling device can comprise heating elements, for example in the form of ohmic heating elements, which can be arranged in a grid arrangement. It is also possible to provide radiation sources, which act on the substrate or on the reflective optical element by thermal radiation (e.g. IR radiation), as heating elements in order to thermally manipulate said substrate or said reflective optical element. In this case, an absorption layer serving to absorb the IR radiation can be arranged below a reflective surface of the optical element. Control parameters which are related to the temperature or the deformation of the optical element can be fed to a control device of the heat-controlling device such that the control device can be used to reduce the aberrations of the reflective optical element.

WO 2013/044936 A1 discloses the practice of arranging a wavefront correction device comprising a refractive optical element in a microlithographic projection lens. First and second heating radiation can be radiated onto a first and second portion, respectively, of a circumferential edge area of the refractive optical element, which heating radiation at least partly penetrates into the optical element. A refractive index distribution caused by the partial absorption of the heating radiation within the optical element serves to modify or at least partly correct a wavefront error.

PCT/EP2013/000728 proposes to arrange in a projection lens a wavefront correction device in the form of a mirror comprising a reflective coating and a mirror substrate. First and second heating radiation can be radiated into a first and second portion, respectively, of a circumferential edge area of the mirror substrate, which heating radiation at least partly penetrates into the mirror substrate. A temperature distribution in the substrate caused by the partial absorption of the heating radiation leads to a deformation of the mirror, which serves to modify or at least partly correct a wavefront error.

WO 2009/046955 A2 describes a device for controlling the temperature of an optical element which is provided in a vacuum atmosphere. The device comprises a cooling apparatus, which comprises a radiation-cooling part spaced apart from the optical element so as to cool the optical element by radiation with the aid of heat transfer. The device also comprises a control device for controlling the temperature of the radiation-cooling part and a heating part for heating the optical element, wherein the heating part is connected to the control device in order to control the temperature of the heating part.

WO 2009/152959 A1 describes a projection exposure apparatus for semiconductor lithography, which comprises a thermal manipulation device of an optical element comprising a front side for reflecting electromagnetic radiation and a rear side. Thermal actuators which act on the optical element from the rear side are present. The thermal actuators can be LEDs or lasers, the emission spectrum of which can lie in the IR wavelength range. Such thermal actuators can emit electromagnetic radiation which at least partly passes through the substrate and which is at least partly absorbed by an absorption layer arranged between the substrate and the multi-layer coating. The absorption layer can include a lacquer layer, a metal powder, aluminium or a glass and has a typical thickness of between 5 µm and 15 µm.

SUMMARY

It is an object of the invention to improve an optical element and an optical arrangement in respect of the suitability thereof for thermal manipulation by heating radiation.

This object is achieved by an optical element comprising: a substrate and a coating, wherein the coating comprises: a reflective coating, in particular a reflective multi-layer coating, embodied for reflecting radiation with a used wavelength and an antireflection coating arranged between the substrate and the reflective coating for suppressing the reflection of heating radiation with a heating wavelength that differs from the used wavelength. The heating wavelength is typically larger than the used wavelength.

The inventors have identified that, when supplying heating radiation to the reflective coating, a not insignificant part of the heating radiation is reflected by the reflective coating. If the used wavelength lies in the EUV wavelength range, the heating radiation is generally radiated-in through the substrate from the rear side of the substrate, i.e. from the side of the substrate distant from the reflective coating, since, if the heating radiation were radiated onto the front side of the substrate, an antireflection coating, which has a sufficient antireflective effect on the heating radiation, would greatly reduce the reflectivity of the radiation in the case of the used wavelength in the EUV wavelength range. The reflected heating radiation can be incident directly or indirectly, i.e. via additional strongly reflective components, e.g. cooling bodies, on other optical elements, e.g. mirrors or—in the case of a projection exposure apparatus—on the wafer, and can lead to parasitic, undesired heating there. As a result of the application of an antireflection coating between the reflective coating and the substrate, an antireflective effect can be provided for the heating radiation passing through the substrate and the reflection of the heating radiation can thus be suppressed.

Within the meaning of this application, an antireflection coating is understood to mean a coating which achieves a reduction in the reflectivity by destructive interference of the reflected heating radiation. This means that the layer materials and the layer thicknesses of the layers of the antireflection coating must be selected in such a way that destructive interference is brought about for the heating radiation that is incident on the antireflection coating through the substrate. The properties of the layer materials relevant to the destructive interference are the (wavelength dependent) refractive index n and the (wavelength dependent) absorption coefficient k, which together form the complex refractive index $n=n-ik$ of a respective layer material.

In order to produce destructive interference, the antireflection coating can comprise a plurality of individual layers. In this case, the layer composition of the antireflection coating is preferably periodic or partly periodic. However, the antireflection coating can also comprise only a single layer, the layer thickness and layer properties (complex refractive index) of which are matched to the properties of the substrate and the properties of the reflective coating in such a way that the antireflection layer has an antireflective effect on the heating radiation at the heating wavelength.

In an advantageous embodiment, the whole coating applied to the substrate is embodied to completely absorb the heating radiation. Within the meaning of this application, a complete absorption is understood to mean that the whole coating has an absorptivity of more than 99%, preferably of more than 99.9%, for the heating radiation at the heating wavelength. What can be achieved thereby is that practically no heating radiation is transmitted by the coating, and so, when the heating radiation is radiated-in from the rear side, this heating radiation cannot emerge at the front side of the optical element and cannot lead to parasitic heating. What is required for the complete absorption of the heating radiation is that at least one layer, typically a plurality of layers, of the coating has/have an absorption coefficient k not equal to zero for heating radiation at the heating wavelength. Which portion of the heating radiation is absorbed at the individual absorbing layers is determined by interferences and depends on the thicknesses of the absorbing layers.

In one embodiment, the antireflection coating is embodied to at least partly absorb the heating radiation, i.e. the antireflection coating comprises at least one layer which has an absorption coefficient k not equal to zero for the heating wavelength of the heating radiation. What can be achieved by the application of an antireflection coating with a heating radiation-absorbing effect in the case of rear-side radiating-in of the heating radiation is that the heating radiation is already partly, or possibly completely, absorbed by the antireflection coating. By way of example, the antireflection coating can be embodied to absorb a portion of at least approximately 30% of the heating radiation. To the extent that the absorption of the remainder of the coating is sufficient for the heating radiation, it is not mandatory for the antireflection coating also to include materials that absorb the heating radiation.

In one embodiment, the optical element additionally comprises a coating which at least partly absorbs the heating radiation and which is preferably arranged adjacent to the antireflection coating. The absorbing coating is preferably arranged between the antireflection coating and the reflective coating if the heating radiation, as described above, is radiated-in from the rear side of the substrate. If the absorption of the whole coating is insufficient for the heating radiation at the heating wavelength, the absorbing coating can prevent heating radiation transmitted by the antireflection coating from passing through the reflective coating and emerging at the front side of the optical element, i.e. the absorbing coating serves to increase the absorptivity of the whole coating to more than 99% or more than 99.9%.

If the optical element is embodied for reflecting EUV radiation, the reflective coating is typically embodied as a high reflectivity (HR) coating for a used wavelength in the EUV wavelength range. In this case, a further coating can be arranged between the HR coating and the substrate in order to protect the substrate from damaging EUV radiation (a so-called substrate protection layer (SPL) coating) and/or in order to prevent an unwanted deformation of the optical element (a so-called anti-stress layer (ASL) coating). Such a coating is typically non-transmissive to the heating radiation (transmissivity close to zero), and so it forms an absorbing coating and an additional absorbing coating can be dispensed with.

The HR coating also typically includes materials which have an absorption coefficient that differs from zero for the heating radiation. If the reflective coating has a sufficient thickness, for example 50 or more periods with at least one layer made of a material which absorbs the heating radiation, the absorptivity of the reflective coating itself may be sufficient to completely absorb the heating radiation.

If the transmissivity should not be sufficiently small despite the SPL coating or the ASL coating and the antireflection coating, it is optionally possible to additionally apply a sufficiently strongly absorbing absorption layer or absorption coating between the reflective coating and the antireflection coating. In this case, the absorbing coating can comprise an absorption layer which, for example, can be embodied in the manner described in WO 2009/152959 A1 cited above.

In one development, the coating absorbing the heating radiation is a multi-layer coating. The ASL coating or SPL coating described above is often a multi-layer coating. An additional absorbing coating can also comprise a layer composition with a plurality of individual layers where necessary.

In one development, the coating absorbing the heating radiation includes at least one metallic material. By way of example, the metallic material can be nickel (Ni), molybdenum (Mo) or aluminium (Al). However, other materials, for example metalloids such as silicon (Si), may also be included in the coating which absorbs the heating radiation.

In a further embodiment, the substrate is formed from a material which is at least partly, in particular (almost) completely transparent to the heating radiation. The substrate material should absorb the heating radiation as little as possible. By way of example, the material can be fused quartz ($SiO_2$). However, particularly in the case of EUV mirrors, so-called zero-expansion materials, i.e. materials which only have a very small coefficient of thermal expansion (CTE) in the region of the operating temperatures used there, are typically used as substrate materials.

Such a mirror material is a synthetic, amorphous fused quartz which has a small portion of doping with titanium. An example of such a commercially available silica glass is distributed under the trade name ULE® (Ultra Low Expansion glass) by Corning Inc. The mirror material ULE® has a sufficiently low absorption for heating radiation for wavelengths lying between approximately 193 nm and approximately 2300 nm.

As an alternative to using a doped fused quartz, specifically a $TiO_2$-doped fused quartz, it is also possible to use a glass-ceramic as a zero-crossing material. The transmission of such a glass-ceramic, e.g. of Zerodur®, is typically sufficient for the present application in the wavelength range in which typical heating wavelengths of the heating radiation lie.

In one embodiment, the suppression of the reflection of the heating radiation by the antireflection coating is maximal at a heating wavelength of more than 400 nm (and generally less than 900 nm). The antireflection coating is typically optimized for the suppression of heating radiation at a specific wavelength such that the suppression of the reflection has a maximum at the heating wavelength (or in a range near the heating wavelength). The preferred wavelength range for the heating wavelengths lies between approximately 400 nm and approximately 900 nm since heating light sources, in particular in the form of heating diodes, with a long service life exist in this wavelength range. It is understood that use can optionally also be made of heating radiation with heating wavelengths in the IR wavelength range above 900 nm.

The heating radiation produced by a heating light source can be substantially monochromatic, i.e. the radiation intensity is concentrated about the maximum of the heating wavelength, as is the case, for example, for laser diodes. Since the antireflection effect by the antireflection layer typically still is relatively large in a comparatively large wavelength range of, in general, approximately +/−50 nm around the wavelength for which the suppression of the reflection is at a maximum, it is optionally also possible to use heating light sources which emit heating radiation in a comparatively broadband wavelength range. By way of example, it is possible to use heating light sources which emit heating radiation at heating wavelengths which substantially lie in a wavelength range which e.g. deviates by approximately +/−50 nm from the wavelength for which the suppression of the reflection by the antireflection layer is at a maximum.

In a further embodiment, the antireflection coating includes at least one material selected from the group comprising: $B_4C$, Si, $Si_3N_4$, C, Ru, Mo, Ni, ZrN, SiC, $ZrO_2$, La, B. In any case, these materials are typically used for the coating of EUV mirrors designed for the reflection of EUV radiation at approximately 13.5 nm, and so, within one and the same coating process, the antireflection coating can be applied onto the substrate together with the remaining coating, i.e. the reflective coating and, optionally, the SPL coating and/or the ASL coating. In this case, the application of the antireflection coating and the layers of the EUV coating can be brought about by an EUV-typical coating technology, i.e., generally, vapour deposition, for example by sputtering.

In a further embodiment, the antireflection coating has a thickness of less than 500 nm, preferably of less than 100 nm, in particular of less than 50 nm. The thickness of the antireflection coating or the thicknesses of the individual layers thereof preferably lies/lie in an order of magnitude that is typical for vapour deposition and/or for EUV coatings.

In one embodiment, a reflectivity of the reflective coating is maximal for EUV radiation with a used wavelength in the wavelength range between 1 nm and 35 nm, i.e. the used wavelength lies within the so-called EUV wavelength range, which approximately comprises the range between 1 nm and 35 nm. In the current EUV lithography apparatuses, approximately 13.5 nm is typically used as used wavelength; in future lithography apparatuses, use may possibly be made of a shorter wavelength. A consequence of the high absorption of the EUV wavelengths is that no refractive optics such as e.g. lens elements can be used for beam shaping, use rather has to be made of mirror optics.

In an advantageous development, the optical element is embodied as an EUV mirror or as an EUV mask. An EUV mirror serves for reflecting EUV radiation, typically over the whole optical surface thereof. An EUV mask comprises portions that reflect EUV radiation and (generally absorbing) portions that do not reflect EUV radiation or only slightly reflect EUV radiation, which portions together form a structure which is illuminated with EUV radiation by an illumination unit and imaged on a wafer by a projection lens. The reflective structures should reflect the highest possible portion of EUV radiation and can be formed by a reflective coating as is described above.

In an alternative embodiment, a reflectivity of the reflective coating is maximal for VUV radiation with a used wavelength in the wavelength range between 150 nm and 260 nm. The optical element is typically a VUV mirror. The reflective coating can be embodied as a multi-layer coating, which is optimized for reflecting radiation in the VUV wavelength range. Such a multi-layer coating typically comprises dielectric materials which exhibit virtually no absorption for the heating radiation at the heating wavelength.

In this case, the reflective coating preferably comprises at least one layer at least partly, in particular completely absorbing the heating radiation. For reflecting radiation in the VUV wavelength range, it may possibly be sufficient if the reflective coating is formed from a single, generally metallic layer, e.g. from aluminium. Additional dielectric layers can be applied onto the absorbing layer in order to increase the reflectivity of the reflective coating. One or more dielectric layers, which serve as protective coating, can optionally be applied onto the absorbing layer.

The provision of a metallic layer in the reflective coating is advantageous for the present application since the latter almost completely reflects and/or absorbs the VUV radiation at the used wavelength such that the VUV radiation does not pass through the metallic layer to the antireflection coating applied between the reflective coating and the substrate (transmission close to zero) and this antireflection coating for the rear-side incoming radiation of the heating radiation has a negligible influence on the reflectivity of the optical element for the VUV radiation radiated-in at the front side.

A further aspect of the invention relates to an optical arrangement comprising at least one optical element as described above and a device for thermal manipulation of the at least one optical element, which device comprises at least one heating light source, preferably a plurality of heating light sources, for producing heating radiation. The optical arrangement which includes the at least one optical element can be e.g. a projection lens for an EUV or VUV lithography apparatus, a system for inspecting EUV masks or VUV masks, or an EUV or VUV lithography apparatus.

As described in the introductory part, a desired spatially resolved deformation or figure change of the optical element can be produced by targeted, spatially resolved introduction of heat into the optical element or into the coating. In order to achieve such change in form, the heating radiation, which is typically coupled in from the rear side of the substrate, is absorbed by the whole coating. The typically local increase in temperature of the coating leads to an expansion of the respective layer materials and therefore to a local deformation of the optical surface of the optical element. In order to produce spatially dependent, varying heating of the coating, the device for thermal manipulation is typically embodied to independently or individually set or regulate the radiation power of the individual heating light sources.

In one embodiment, the device for thermal manipulation comprises a plurality of heating light sources in a grid-shaped or matrix-shaped arrangement. The grid-shaped arrangement with heating light sources arranged equidistantly renders it possible to undertake the thermal manipulation of the optical element with a desired spatial resolution. A suitable front-end optical unit for beam shaping can be disposed upstream of each of the heating light sources.

In a further embodiment, the device for thermal manipulation is embodied to radiate the heating radiation through the substrate and onto the antireflection coating. In the case of optical elements embodied for the reflection of a used wavelength in the VUV wavelength range, the heating radiation may optionally be supplied from the front side since, in the case of a used wavelength in the VUV wavelength range, a sufficiently large absorption of the heating radiation can be achieved in this case without there being too great a deterioration in the reflectivity for the VUV used wavelength. Unlike what is described above for the antireflective effect, in the case of incoming radiation from the front side, it is necessary to modify the dielectric coating between the absorbing (metal) layer and the surrounding medium (air, vacuum) in a suitable manner, for example by modifying the layer thicknesses, the number of individual layers, etc. without or with the use of new layer materials using optical constants n, k (complex refractive index n=n−ik) suitable for the VUV used wavelength and the heating radiation.

In a further embodiment, the at least one heating light source, a deflection device for deflecting the heating radiation and/or a beam guidance device for guiding the heating radiation is/are attached to a cooling body for cooling the optical element. Such a cooling body for the optical element is typically arranged at a distance from the optical element at the rear side thereof and cools the optical element partly by the thermal conduction of a gas situated between the cooling body and the optical element and by taking up the heat emitted by the optical element. Since the cooling body typically extends over the whole rear side of the substrate or the optical element, the cooling body is well suited to coupling heating radiation into the optical element.

A plurality of heating light sources, for example in the form of heating diodes, typically in a grid-shaped arrangement, can be attached to the side of the cooling body facing the substrate for the purposes of coupling-in the heating radiation. Alternatively, receptacle holes can be introduced into the cooling body, to which beam guidance devices, for example in the form of optical fibre cables, are attached. By way of example, a respective end of an optical fibre cable can be connected to an front-end optical unit situated in a respective receptacle hole. Alternatively, deflection devices can be provided on the side of the cooling body facing the optical element, which deflection devices deflect the heating radiation, which is typically guided along the upper side of the substrate in this case, in the direction of the substrate. In this case of free beam propagation, the heating radiation can be guided to the deflection elements, but it is generally more expedient for the heating radiation to be guided to the deflection elements by way of beam guidance devices, for example by optical fibre cables. When the heating radiation is guided with the aid of a beam guidance device, the heating light sources may optionally be arranged outside of a housing, in particular an evacuated housing, of the optical arrangement.

In one embodiment, the optical arrangement is embodied as an EUV lithography apparatus. The thermally manipulable optical element can be e.g. a mirror, which is arranged in an illumination unit or in a projection lens of the EUV lithography apparatus.

In one development, the optical element is an EUV mask which is displaceable in a movement direction. In the case of EUV lithography apparatuses in the form of so-called wafer scanners, the illumination unit generally only illuminates a strip-shaped portion of the EUV mask and the mask is moved along a movement direction, which is also referred to as scanning direction, using a suitable actuator during the exposure.

In one development of this embodiment, the device for thermal manipulation is arranged in a stationary manner or the at least one heating light source for aligning the heating radiation onto the EUV mask, a deflection device for deflecting the heating radiation onto the EUV mask and/or a beam guidance device for guiding the heating radiation to the EUV mask is/are displaceable together with the EUV mask in the movement direction.

In the first case, the device for thermal manipulation is arranged in a stationary manner. In order to achieve targeted spatially resolved heating of the EUV mask and therefore the desired spatially resolved figure change in this case, the movement of the EUV mask must be considered during the individual actuation of the heating light sources. The heating power or the intensity of the heating radiation from the individual sources of the EUV mask in this case follows the moved mask such that the desired local heat influx always occurs at a respective location of the EUV mask. In this case, the device for thermal manipulation is embodied when actuating the heating light sources to take into account the position of the EUV mask during the movement thereof along the scanning direction.

In the second case, the heating light sources, the deflection devices or the beam guidance devices are moved together with the EUV mask, i.e. the position thereof relative to the moved EUV mask does not change. In this case, the heating light sources can be controlled in such a way as if the EUV mask has a stationary arrangement. As was described above, the heating light sources, the deflection devices and/or the beam guidance devices are preferably attached to a cooling body, and so, in the simplest case, the movement of these components can be brought about by displacing the cooling body together with the EUV mask in the movement direction.

In an alternative embodiment, the optical arrangement is embodied as a catadioptric projection lens for VUV microlithography. In addition to transmissive optical elements, e.g. in the form of lens elements, such a projection lens also comprises one or more reflective optical elements (mirrors), which, as described above, can be used for thermal manipulation, in particular for correcting wavefront aberrations.

In one development, the reflective optical element is arranged in the region of a pupil plane of the catadioptric projection lens. A thermal manipulation of a pupil-near mirror is advantageous for correcting wavefront errors or aberrations. The introduction of heating radiation from the front side of the substrate can lead to unwanted stray light formation within the projection lens, which is why it is advantageous to introduce the heating radiation from the rear side thereof into the optical element and avoid the occurrence of stray light or unwanted return reflections via the antireflection coating.

Further features and advantages of the invention emerge from the following description of exemplary embodiments of the invention, on the basis of the figures of the drawing, which show details essential to the invention, and from the claims. The individual features can be implemented respectively individually on their own or a plurality thereof can be implemented in any combination in a variant of the invention.

BRIEF DESCRIPTION OF THE DRAWINGS

Exemplary embodiments are depicted in the schematic drawing and will be explained in the subsequent description. In detail.

DETAILED DESCRIPTION

In the following description of the drawings, identical reference signs are used for equivalent or functionally equivalent components.

Figure 1:
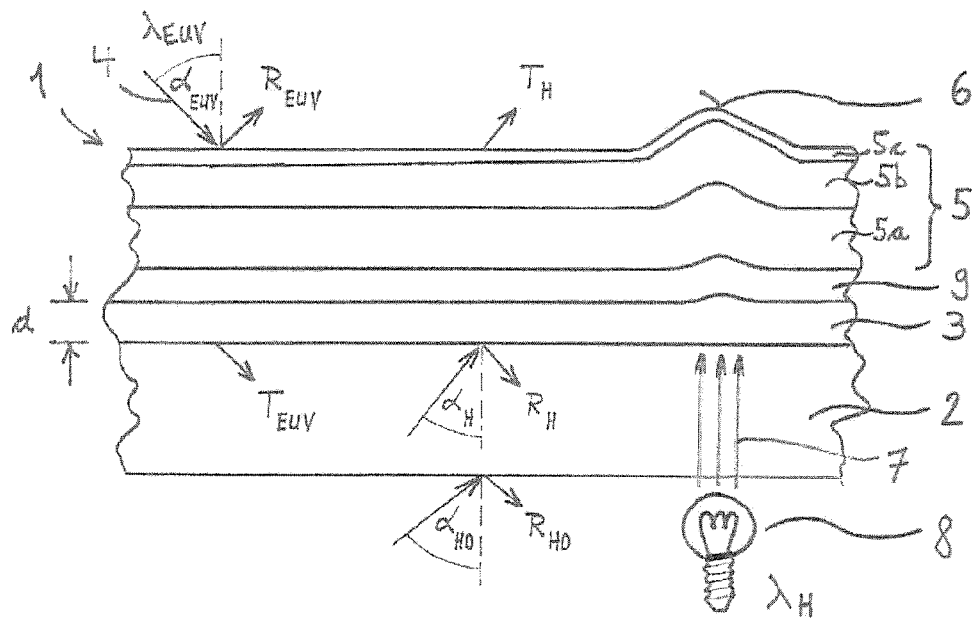
FIG. 1 shows a schematic illustration of an EUV mirror comprising a coating which reflects EUV radiation and comprising an antireflection coating for suppressing the reflection of heating radiation which is fed to the EUV mirror from the rear side of a mirror substrate.

FIG. 1 schematically shows an optical element 1 in the form of an EUV mirror which comprises a substrate 2, an antireflection coating 3 applied to the substrate 2 and an EUV coating 5. The EUV coating 5 comprises a coating 5b (a so-called HR coating) which reflects the EUV radiation 4 at a used wavelength $\lambda_{EUV}$. In addition, a cover layer or a cover layer system (a so-called cap coating 5c) which is intended to protect the whole EUV coating 5 from oxidation or corrosion, for example when the optical surface 6 is cleaned with a hydrogen plasma, is applied onto the reflective coating 5b. The cap coating 5c is arranged adjacent to an optical surface 6 of the EUV mirror, which forms the interface of the EUV mirror 1 with the environment.

The reflective coating 5b comprises a plurality of individual layers (not depicted in FIG. 1), which generally consist of layer pairs made of two materials with different refractive indices. If use is made of EUV radiation 4 at a used wavelength in the region of $\lambda_{EUV}$=13.5 nm, the individual layers usually consist of molybdenum and silicon. Depending on the used wavelength $\lambda_{EUV}$, other material combinations such as e.g. molybdenum and beryllium or ruthenium and beryllium or lanthanum and $B_4C$ are likewise possible. In addition to the individual layers, the reflective coating 5b generally comprises intermediate layers for preventing diffusion (so-called barrier layers).

The EUV coating 5 of FIG. 1 comprises a so-called SPL (substrate protection layer) coating 5a below the reflective coating 5b in order to protect the substrate 2 from damaging EUV radiation 4. In addition, or as an alternative, to an SPL coating 5a, a so-called ASL (anti-stress layer) coating can also be provided under the reflective coating 5b on the EUV mirror 1 in order to avoid undesired deformations as a result of layer stresses.

The aforementioned antireflection coating 3 is applied between the EUV coating 5 and the substrate 2, said antireflection coating serving to suppress the reflection of heating radiation 7 which is coupled into the EUV mirror 1 from the rear side of the substrate 2. The heating radiation 7 is produced by a heating light source 8 which, in the shown example, is arranged in the vicinity of the substrate 2. The heating radiation 7 serves for the thermal manipulation of the EUV mirror 1, more precisely for producing a thermally induced, targeted spatially resolved deformation or figure change of the optical surface 6 by targeted spatially dependent heating of the EUV coating 5. The heat influx into the EUV coating 5 and/or into the antireflection coating 3 leads to an expansion of the layer materials which leads to a deformation of the optical surface 6, as indicated in FIG. 1.

An undesirable dimensional deviation of the optical surface 6 of the EUV mirror can be corrected in a targeted, spatially dependent manner with the heating radiation 7, or the form of the optical surface 6 can be manipulated in a targeted, spatially dependent manner. Since the heating radiation can also be supplied during the operation of the EUV mirror 1, the requirements on the dimensional accuracy (the so-called figure) of the surface 6 of the EUV mirror can be met both during the first adjustment and also during the operation of the EUV mirror 1. This is advantageous since there can be undesired figure changes during the operation of the EUV mirror 1 as a result of heating and absorption (so-called "mirror heating") and as a result of material compaction ("compaction").

The heating radiation 7 has a heating wavelength $\lambda_H$ (possibly a heating wavelength range) which typically lies at more than 400 nm and which is absorbed from the whole coating 5, 3—by the SPL coating 5a and the antireflection coating 3 in the example shown here—i.e. the coating 5, 3 is practically opaque to the heating radiation 7 (absorptivity >99.9%) and the transmissivity $T_H$ of the coating 5, 3 for the heating radiation 7 is virtually zero. In the shown example, the reflective coating 5b and the cap coating 5c absorb no heating radiation 7 since the latter is practically completely absorbed by the SPL coating 5a and the antireflection coating 3. Both the reflective coating 5b and the cap coating 5c typically contain layer materials which absorb the heating radiation 7. Thus, if the SPL coating 5a were not present, a large portion of the heating radiation 7 would be absorbed by the reflective coating 5b and the cap coating 5c.

If the transmissivity $T_H$ of the whole coating 5, 3 should nevertheless be insufficiently low, an additional absorbing coating 9 (which is shown in FIG. 1) can optionally be arranged between the antireflection coating 3 and the EUV coating 5 in order to further reduce the transmissivity $T_H$. The absorbing coating 9 has a thickness that is large enough to produce the desired absorbing effect for the heating radiation 7 and can consist of one or more layers. By way of example, the absorbing coating 9 can include a metallic material, e.g. aluminium or a metal powder. Moreover, the absorbing coating 9 can comprise a lacquer layer or include a glass. In the following, the assumption is made that the absorption of the whole coating 5, 3, in particular of the SPL coating 5a and the antireflection coating 3, is sufficient for the heating radiation 7 and that, therefore, no additional absorbing coating 9 is necessary.

Table 1, which follows below, shows an example for an EUV coating 5 consisting of an SPL coating 5a, an HR coating 5b and a cap coating 5c. In the shown example, the substrate 2 (mirror material) is synthetic, amorphous fused quartz ($SiO_2$). In reality, the fused quartz ($SiO_2$) is typically doped with titanium for EUV applications, i.e. it is ULE®. However, the doping with titanium has a negligible influence on the results described further below, and so the subsequent calculations were carried out with fused quartz as substrate material for simplification purposes.

TABLE 1

| | Layer composition | Number of individual layers |
|---|---|---|
| Vacuum | | |
| Cap coating: | 3.377Si 0.4B$_4$C 2.068 Ru | 3 |
| HR coating: | (3.878Si 0.5C 2.536Mo)^50 | 150 |

TABLE 1-continued

| | Layer composition | Number of individual layers |
|---|---|---|
| SPL coating: | 6.6Ni (3.5Mo 6.6Ni)^40 | 81 |
| Substrate: | SiO$_2$ | |
| Vacuum | | |

The HR coating 5b is optimized for a used wavelength $\lambda_{EUV}$ of 13.5 nm and for perpendicular incidence of the EUV radiation 4 ($\alpha_{EUV}=0°$). The utilized layer materials of the EUV coating 5 are: nickel (Ni), silicon (Si), carbon (C), molybdenum (Mo), boron carbide ($B_4C$) and ruthenium (Ru). In Table 1, the geometric layer thickness in nm is specified in front of the respective symbol for the layer material. If a plurality of individual layers have been placed between parentheses ( ), this relates to a period and the exponent (^) after the right-hand parenthesis specifies the number of periods. Therefore, the EUV coating 5 in accordance with Table 1 consists of a total of 234 individual layers. The individual layer respectively on the left in the layer composition column is the layer closest to the substrate. As can be gathered from Table 1, the HR coating 5b and the SPL coating 5a generally consist of many individual layers, which are preferably built up periodically or partly periodically, which has advantages from a manufacturing point of view.

The layers made of carbon (C) in the HR coating 5b and the layers made of boron carbide ($B_4C$) in the cap coating 5c, with relatively thin layer thicknesses of 0.5 nm and 0.4 nm, respectively, are so-called barrier layers (see above), which are intended to prevent interdiffusion between the different layer materials of the individual layers.

Figure 2:
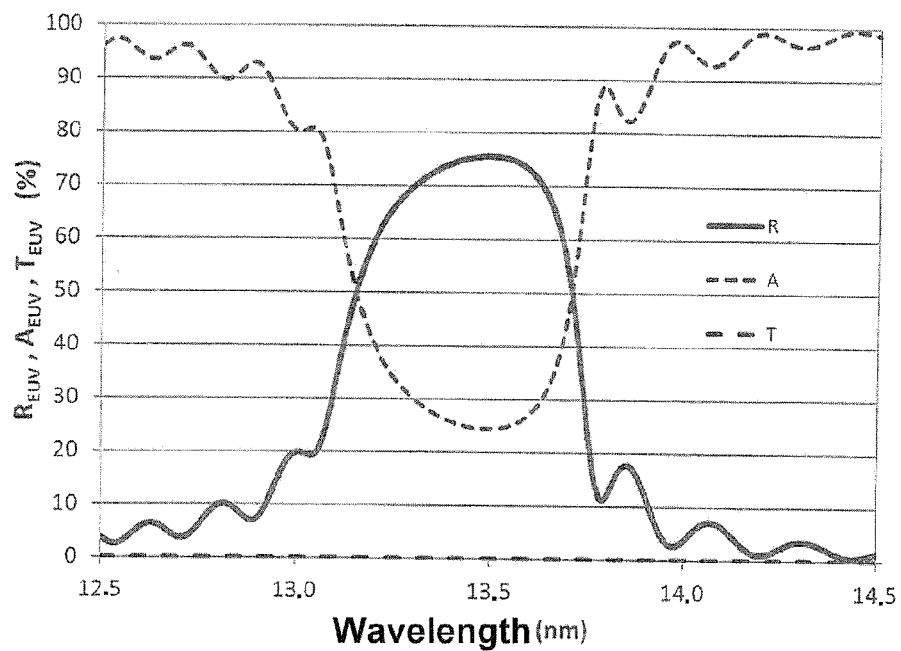
FIG. 2 shows a schematic illustration of the reflectivity, the absorptivity and the transmissivity of the EUV mirror from FIG. 1 for EUV radiation as a function of the wavelength.

For the EUV coating 5 of Table 1, FIG. 2 shows the following values for perpendicular incidence ($\alpha_{EUV}=0°$) of the EUV radiation 4, which values were calculated as a function of the wavelength (between 12.5 nm and 14.5 nm): reflectivity $R_{EUV}$, transmissivity $T_{EUV}$ (cf. FIG. 1) and absorptivity $A_{EUV}$ of the EUV coating 5 (without the antireflection coating 3 and without the additional absorbing coating 9). Since no stray light losses are assumed, $R_{EUV}+T_{EUV}+A_{EUV}=1$ applies. It can clearly be seen in FIG. 2 that the maximum of the reflectivity $R_{EUV}$ of the EUV coating 5 lies at the used wavelength $\lambda_{EUV}$ of 13.5 nm utilized for this example.

What can likewise be identified in FIG. 2 is that the transmissivity $T_{EUV}$ of the EUV coating 5 is approximately zero, and so the influence of additional layers applied under the EUV coating 5, such as the antireflection coating 3, on the reflectivity $R_{EUV}$ is practically negligible at the used wavelength $\lambda_{EUV}$. If, nevertheless, the transmissivity $T_{EUV}$ of the EUV coating 5 should not be sufficiently small, the influence of the antireflection coating 3 on the reflectivity $R_{EUV}$ at the used wavelength $\lambda_{EUV}$ can be taken into account when designing the EUV coating 5.

Figure 3:
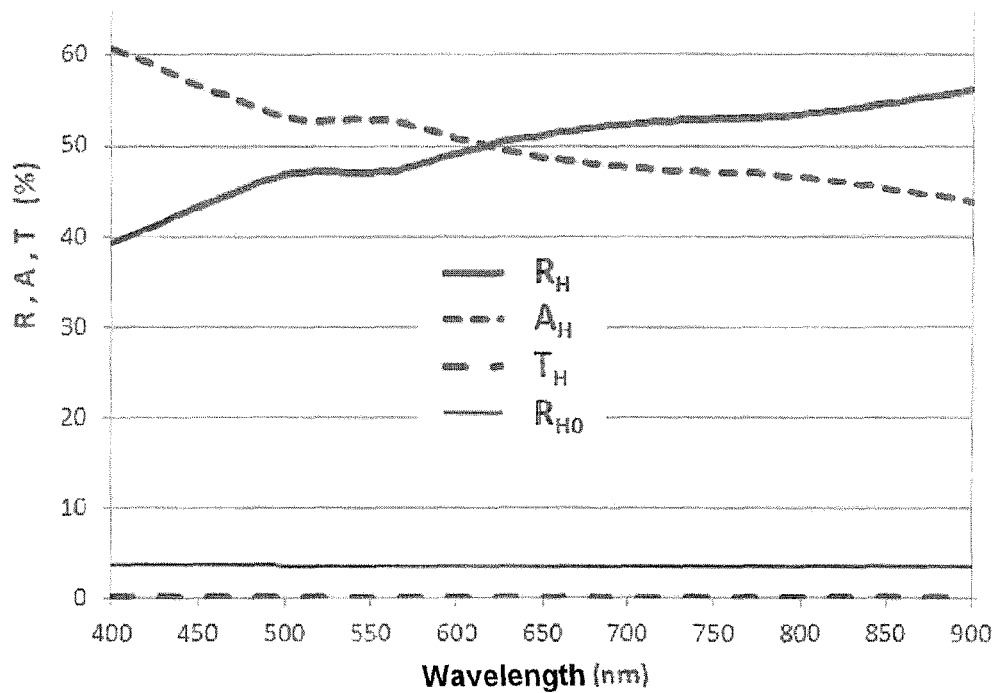
FIG. 3 shows a schematic illustration of the wavelength-dependent reflectivity, absorptivity and transmissivity of an EUV mirror without antireflection coating for heating radiation supplied from the rear side of the mirror substrate.

For the EUV coating 5 of Table 1 (i.e. without antireflection coating 3), FIG. 3 shows the following values, obtained by numerical calculations, for perpendicular incidence ($\alpha_H=0°$, cf. FIG. 1) of the heating radiation 7 for a preferred range of the heating wavelengths $\lambda_H$ from approximately 400 nm to approximately 900 nm: reflectivity $R_H$, transmissivity $T_H$ and absorptivity $A_H$. Since no stray light losses are assumed, $R_H T_H A_H=1$ applies.

In FIG. 3, a large reflectivity $R_H$ of the EUV coating 5, lying between approximately 40% and approximately 55%, is identifiable for the heating radiation 7 in the wavelength range specified above. The heating radiation 7 reflected at the EUV coating 5 can be incident directly or indirectly, i.e. via other strongly reflecting components (e.g. cooling bodies), on other EUV mirrors or, for example, a wafer and can lead to parasitic, undesired heating there.

What can likewise be identified in FIG. 3 is that the transmissivity $T_H$ of the EUV coating 5 for the heating radiation 7 is approximately zero, and so no additional coating 9, which absorbs the heating radiation 7, needs to be applied under the EUV coating 5.

FIG. 3 also depicts the reflectivity $R_{H0}$ (cf. FIG. 1) at the interface between the environment (vacuum) and the substrate 2 for perpendicular incidence ($\alpha_{H0}=0°$) of the heating radiation 7. Compared with the reflectivity $R_H$ at the interface between the EUV coating 5 and the substrate 2, the reflectivity $R_{H0}$ of approximately 4% in the wavelength range shown above at this interface is comparatively small. However, if reflections of the heating radiation 7 at the interface between the vacuum and the substrate 2 are still disturbing, the substrate 2 can also be provided with an antireflection effect for the heating radiation 7, i.e. an additional antireflection coating can be applied to the lower side of the substrate 2.

Below, six examples for an EUV mirror 1 comprising the exemplary EUV coating 5 of Table 1 and comprising an antireflection coating 3 optimized for suppressing in each case different heating wavelengths $\lambda_H$ in the wavelength range between approximately 400 nm and approximately 900 nm are described on the basis of FIG. 4 to FIG. 9. All examples are optimized and calculated for perpendicular incidence ($\alpha_H=0°$) of the heating radiation 7. No stray light losses are assumed for all examples, which is why the following applies to the reflectivity R, transmissivity T and absorptivity A: R+T+A=1.

The following Table 2 shows the layer composition of the EUV mirror 1 for the example of an antireflection coating 3 which is formed from an individual layer made of boron carbide $B_4C$ with a comparatively large layer thickness d (cf. FIG. 1) of approximately 20.6 nm. In order to be able to apply the antireflection coating 3 in a common coating process with the EUV coating 5, it should have a thickness d that is not too large and is less than 500 nm, preferably less than 100 nm, particularly preferably less than 50 nm.

TABLE 2

|  | Layer composition | Number of individual layers |
|---|---|---|
| Vacuum |  |  |
| Cap coating: | 3.377Si 0.4B4C 2.068 Ru | 3 |
| HR coating: | (3.878Si 0.5C 2.536Mo)^50 | 150 |
| SPL coating: | 6.6Ni (3.5Mo 6.6Ni)^40 | 81 |
| AR coating: | 20.6B4C | 1 |
| Substrate: | SiO2 |  |
| Vacuum |  |  |

Figure 4:
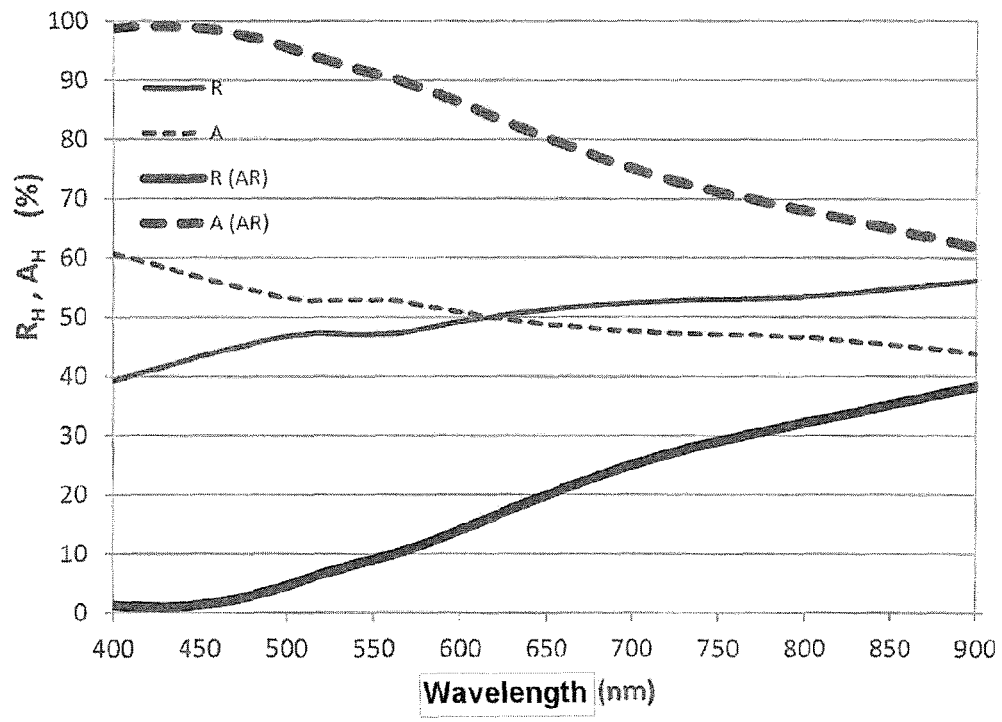
FIG. 4 shows a schematic illustration analogous to FIG. 3, in which, additionally, the reflectivity and absorptivity of an EUV mirror with an antireflection coating are depicted, which is optimized for heating radiation at a heating wavelength of approximately 420 nm.

FIG. 4 shows the calculated variables reflectivity $R_H$ and absorptivity $A_H$ for the coating from Table 2, i.e. for an EUV mirror 1 comprising an antireflection coating 3, compared with the coating from Table 1, i.e. for an EUV mirror 1 without an antireflection coating. Since the transmissivity $T_H$ is approximately zero in both cases and since $T_H=1-R_H-A_H$ applies due to the assumption of no stray light losses, the transmissivity $T_H$ is not depicted in FIG. 4 for the purposes of providing a better overview.

What can clearly be identified on the basis of FIG. 4 is that the antireflection coating 3 is optimized for heating wavelengths $\lambda_H$ in the region around approximately 420 nm since the reflectivity $R_H$ is minimal and the absorptivity $A_H$ is maximal in this wavelength range. In particular, a significant reduction in the reflectivity $R_H$ and a significant increase in the absorptivity $A_H$ can be identified in this wavelength range in relation to the example without an antireflection coating 3 shown in FIG. 3.

Table 3 below shows the layer composition of the EUV mirror 1 for the example of an antireflection coating 3 that is optimized for heating wavelengths $\lambda_H$ around approximately 450 nm.

TABLE 3

|  | Layer composition | Number of individual layers |
|---|---|---|
| Vacuum |  |  |
| Cap coating: | 3.377Si 0.4B4C 2.068 Ru | 3 |
| HR coating: | (3.878Si 0.5C 2.536Mo)^50 | 150 |
| SPL coating: | 6.6Ni (3.5Mo 6.6Ni)^40 | 81 |
| AR coating: | (1Si 4.981Si3N4)^5 | 10 |
| Substrate: | SiO2 |  |
| Vacuum |  |  |

In this example, the antireflection coating 3 consists of 10 individual layers. The layer materials of the antireflection coating 3 are the materials of silicon (Si) and silicon nitride ($Si_3N_4$), which are conventional for EUV. If DC sputtering is used, $Si_3N_4$ can be produced by using an Si-target and nitrogen ($N_2$) as a reactive gas. The layer composition of the antireflection coating 3 is periodic and the thicknesses of the individual layers lie in a range that is conventional for EUV coatings, which has advantages from a manufacturing point of view.

Figure 5:
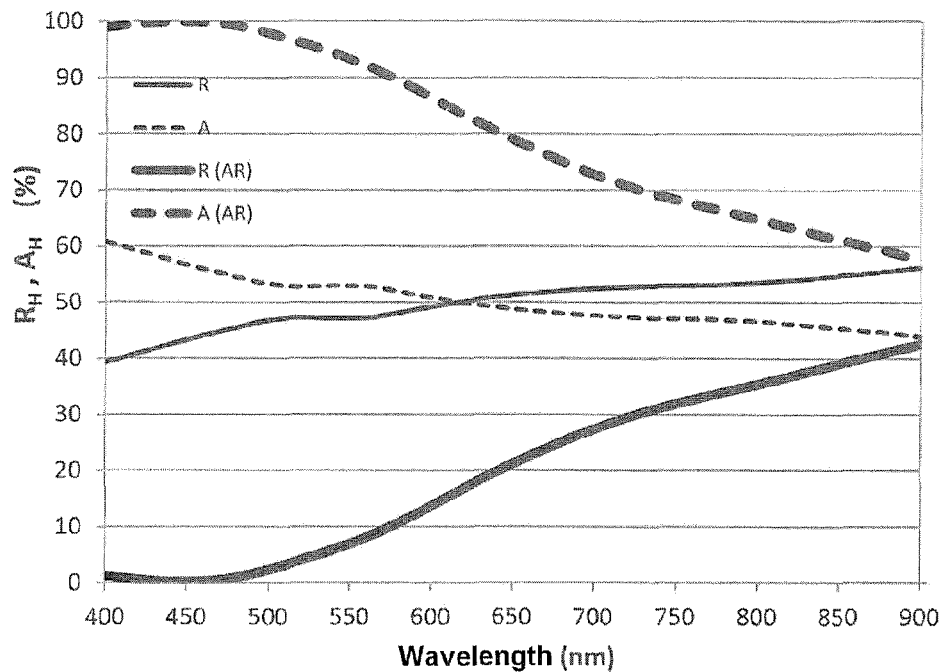
FIG. 5 shows a schematic illustration analogous to FIG. 4, in which the antireflection coating is optimized for heating radiation at a heating wavelength of approximately 450 nm.

FIG. 5 shows the calculated values reflectivity $R_H$ and absorptivity $A_H$ for the EUV mirror from Table 3 compared with the EUV mirror from Table 1, i.e. for an EUV mirror 1 without an antireflection coating. What can clearly be identified on the basis of FIG. 5 is that the antireflection coating 3 is optimized for heating wavelengths $\lambda_H$ in the region around approximately 450 nm since the reflectivity $R_H$ is minimal and the absorptivity $A_H$ is maximal in this wavelength range.

Table 4 below shows the layer composition of the EUV mirror 1 for the example of an antireflection coating 3 that is optimized for heating wavelengths $\lambda_H$ around approximately 590 nm.

TABLE 4

|  | Layer composition | Number of individual layers |
|---|---|---|
| Vacuum |  |  |
| Cap coating: | 3.377Si 0.4B4C 2.068 Ru | 3 |
| HR coating: | (3.878Si 0.5C 2.536Mo)^50 | 150 |
| SPL coating: | 6.6Ni (3.5Mo 6.6Ni)^40 | 81 |
| AR coating: | (3.174Si 3.787Si3N4)^4 | 8 |
| Substrate: | SiO2 |  |
| Vacuum |  |  |

In this example, the antireflection coating 3 consists of 8 individual layers. Like in Table 3, the layer materials of the antireflection coating 3 are silicon (Si) and silicon nitride ($Si_3N_4$), the layer composition of the antireflection coating 3 is periodic and the thicknesses of the individual layers lie in a range that is conventional for EUV coatings.

Figure 6:
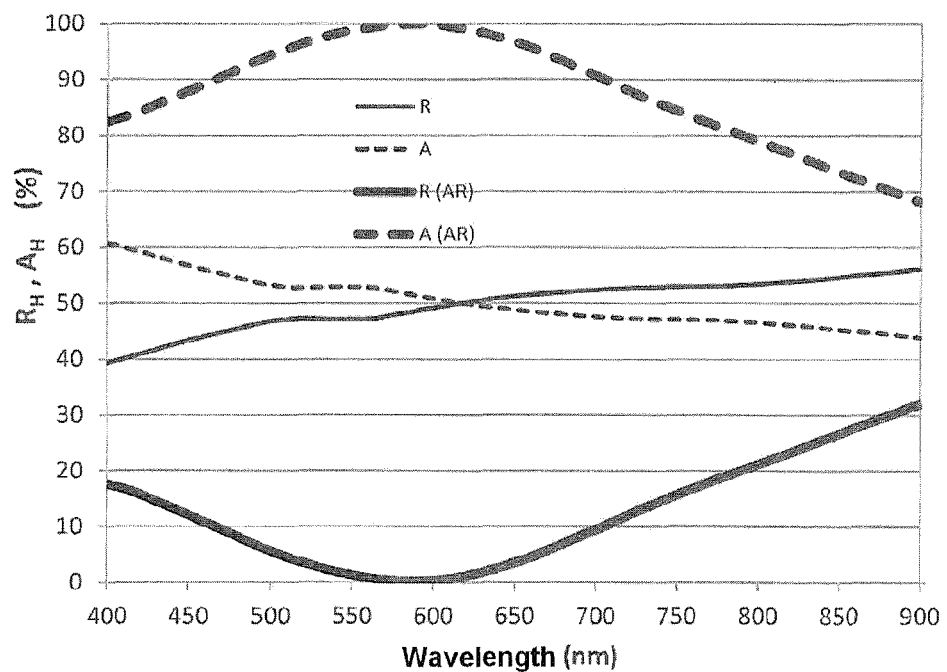
FIG. 6 shows a schematic illustration analogous to FIG. 4, in which the antireflection coating is optimized for heating radiation at a heating wavelength of approximately 590 nm.

FIG. 6 shows the calculated values reflectivity $R_H$ and absorptivity $A_H$ for the EUV mirror from Table 4 compared with the EUV mirror from Table 1, i.e. for an EUV mirror 1 without an antireflection coating. What can clearly be identified on the basis of FIG. 6 is that the antireflection coating 3 is optimized for heating wavelengths $\lambda_H$ in the region around approximately 590 nm.

Table 5 below shows the layer composition of the EUV mirror 1 for the example of an antireflection coating 3 that is optimized for heating wavelengths $\lambda_H$ around approximately 670 nm.

TABLE 5

|  | Layer composition | Number of individual layers |
|---|---|---|
| Vacuum |  |  |
| Cap coating: | 3.377Si 0.4B$_4$C 2.068 Ru | 3 |
| HR coating: | (3.878Si 0.5C 2.536Mo)^50 | 150 |
| SPL coating: | 6.6Ni (3.5Mo 6.6Ni)^40 | 81 |
| AR coating: | (2.718Si 4.502C)^5 | 10 |
| Substrate: | SiO$_2$ |  |
| Vacuum |  |  |

In this example, the antireflection coating 3 consists of 10 individual layers. The layer materials of the antireflection coating 3 are silicon (Si) and carbon (C), which are conventional for EUV, the layer composition of the antireflection coating 3 is periodic and the thicknesses of the individual layers lie in a range that is conventional for EUV coatings.

Figure 7:
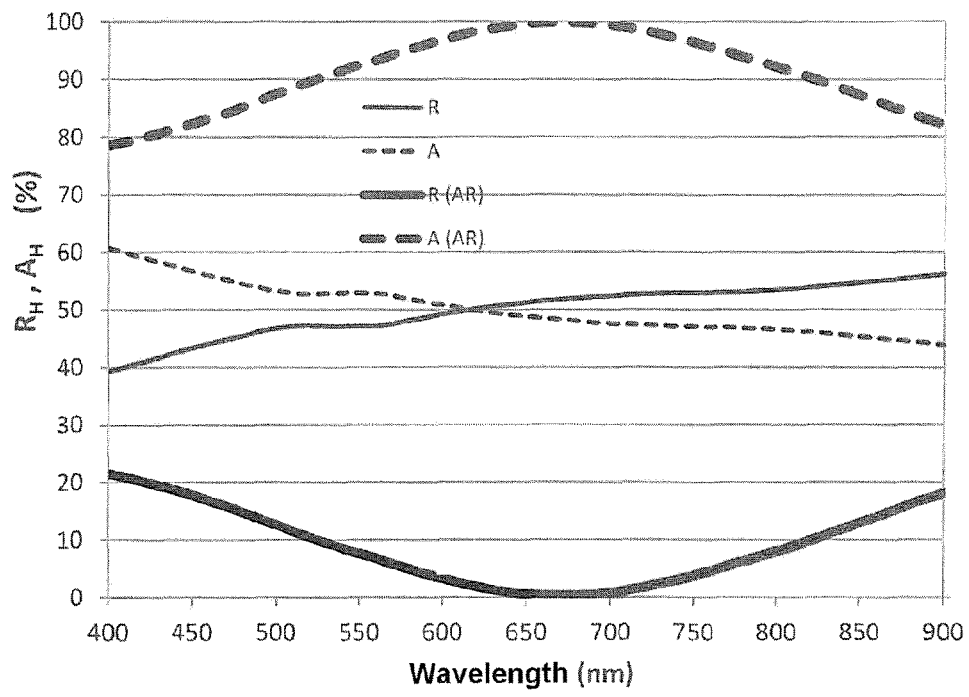
FIG. 7 shows a schematic illustration analogous to FIG. 4, in which the antireflection coating is optimized for heating radiation at a heating wavelength of approximately 670 nm.

FIG. 7 shows the calculated values reflectivity $R_H$ and absorptivity $A_H$ for the EUV mirror from Table 5 compared with the EUV mirror from Table 1. What can clearly be identified on the basis of FIG. 7 is that the antireflection coating 3 is optimized for heating wavelengths $\lambda_H$ in the region around approximately 670 nm.

Table 6 below shows the layer composition of the EUV mirror 1 for the example of an antireflection coating 3 that is optimized for heating wavelengths $\lambda_H$ around approximately 800 nm.

TABLE 6

|  | Layer composition | Number of individual layers |
|---|---|---|
| Vacuum |  |  |
| Cap coating: | 3.377Si 0.4B$_4$C 2.068 Ru | 3 |
| HR coating: | (3.878Si 0.5C 2.536Mo)^50 | 150 |
| SPL coating: | 6.6Ni (3.5Mo 6.6Ni)^40 | 81 |
| AR coating: | (5Si 1.761B$_4$C)^5 | 10 |
| Substrate: | SiO$_2$ |  |
| Vacuum |  |  |

In this example, the antireflection coating 3 consists of 10 individual layers. The layer materials of the antireflection coating 3 are silicon (Si) and boron carbide (B$_4$C), which are conventional for EUV, the layer composition of the antireflection coating 3 is periodic and the thicknesses of the individual layers lie in a range that is conventional for EUV coatings.

Figure 8:
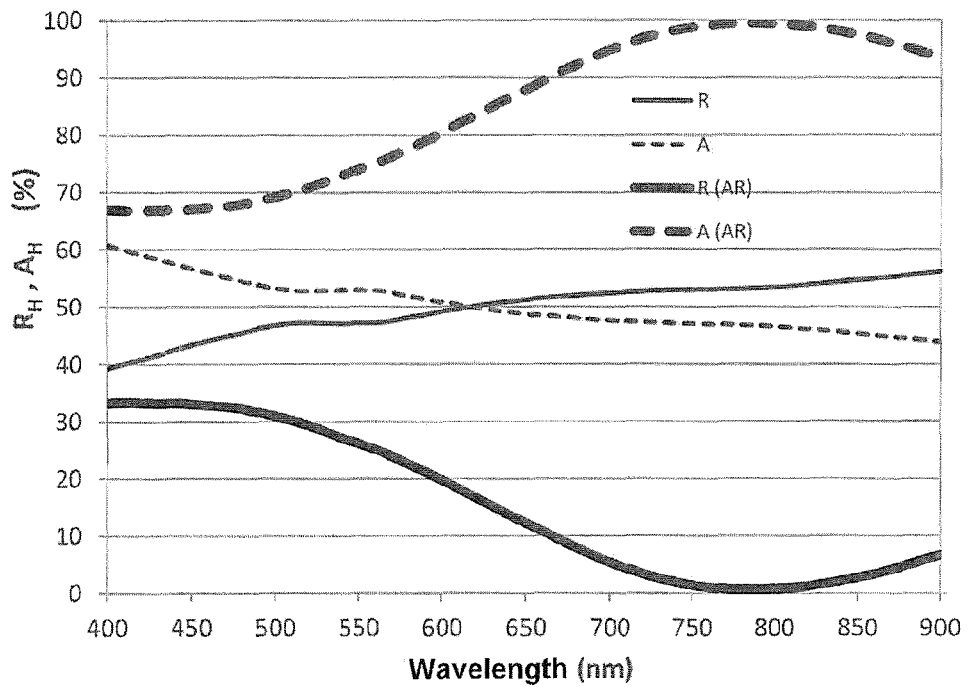
FIG. 8 shows a schematic illustration analogous to FIG. 4, in which the antireflection coating is optimized for heating radiation at a heating wavelength of approximately 800 nm.

FIG. 8 shows the calculated values reflectivity $R_H$ and absorptivity $A_H$ for the EUV mirror from Table 6 compared with the EUV mirror from Table 1. What can be identified on the basis of FIG. 8 is that the antireflection coating 3 is optimized for heating wavelengths $\lambda_H$ in the region around approximately 800 nm.

Table 7 below shows the layer composition of the EUV mirror 1 for the example of an antireflection coating 3 that is optimized for heating wavelengths $\lambda_H$ around approximately 890 nm.

TABLE 7

|  | Layer composition | Number of individual layers |
|---|---|---|
| Vacuum |  |  |
| Cap coating: | 3.377Si 0.4B$_4$C 2.068 Ru | 3 |
| HR coating: | (3.878Si 0.5C 2.536Mo)^50 | 150 |
| SPL coating: | 6.6Ni (3.5Mo 6.6Ni)^40 | 81 |
| AR coating: | 37.3Si | 1 |
| Substrate: | SiO$_2$ |  |
| Vacuum |  |  |

Figure 9:
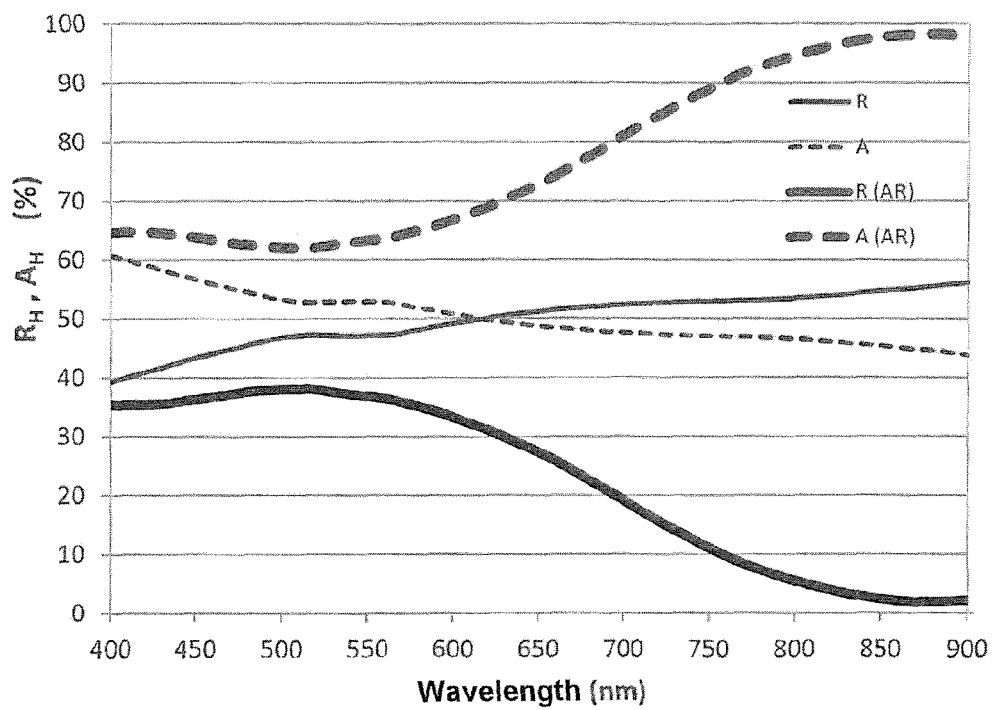
FIG. 9 shows a schematic illustration analogous to FIG. 4, in which the antireflection coating is optimized for heating radiation at a heating wavelength of approximately 900 nm.

In this example, the antireflection coating 3 consists of a single layer made of silicon with a comparatively large thickness, which does not lie in a range that is conventional for EUV coatings FIG. 9 shows the calculated values reflectivity $R_H$ and absorptivity $A_H$ for the EUV mirror 1 from Table 7 compared with the EUV mirror 1 from Table 1. What can be identified on the basis of FIG. 9 is that the antireflection coating 3 is optimized for heating wavelengths $\lambda_H$ in the region around approximately 890 nm.

It was found that the dependence of the reflectivity $R_H$ of the heating radiation 7, radiated-in from the rear side of the substrate 2, on the angle of incidence $\alpha_H$ (cf. FIG. 1) is comparatively small. This is shown below in an exemplary manner for the antireflection coating 3 comprising a layer composition in accordance with Table 4 above, which antireflection coating is optimized for heating wavelengths $\lambda_H$ in the region around approximately 590 nm in the case of perpendicular incidence ($\alpha_H=0°$).

Figure 10:
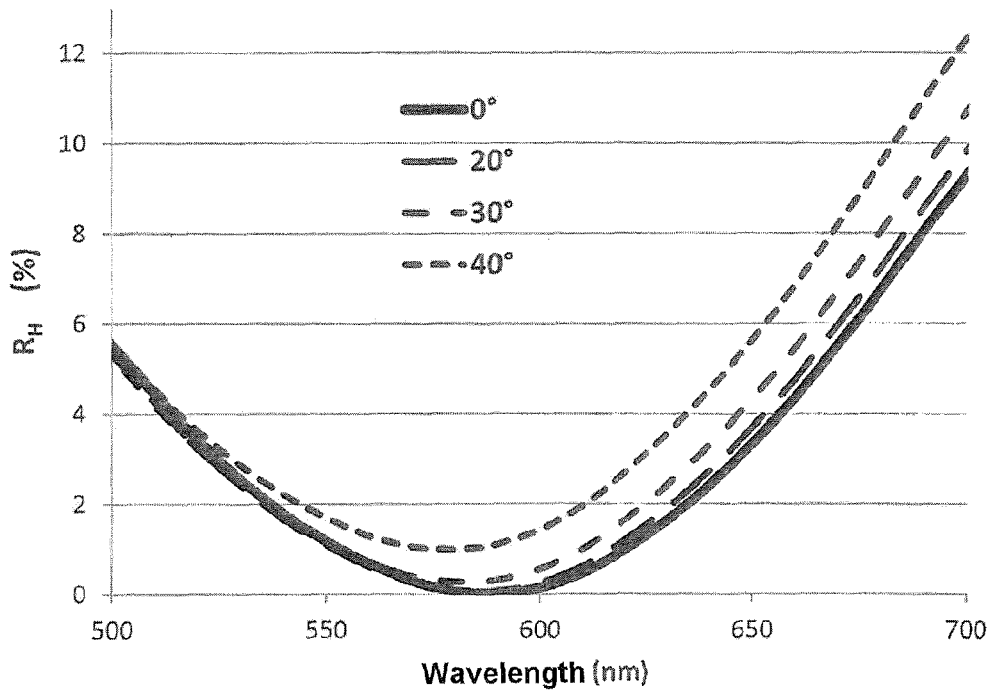
FIG. 10 shows a schematic illustration of the wavelength-dependent reflectivity of an EUV mirror at different angles of incidence of the heating radiation.

FIG. 10 shows the calculated reflectivity $R_H$ for the coating in accordance with Table 4 above for the four following different angles of incidence $\alpha_H$: 0°, 20°, 30° and 40°. The reflectivity $R_H$ was calculated for unpolarized heating radiation 7 in the case of angles of incidence $\alpha_H>0°$. The comparatively small dependence of the reflectivity $R_H$ on the angle of incidence $\alpha_H$ can be clearly identified in FIG. 10.

The properties of the EUV mirror 1 described above, e.g. the reflectivity $R_H$, etc. were calculated with the aid of conventional thin layer software. The optical constants required for the calculations, i.e. the (wavelength dependent) refractive index n and the (wavelength dependent) absorption coefficient k, which together form the complex refractive index n=n−ik of a respective layer material, were taken from standard databases and standard textbooks for optical constants. In the calculations, a linear interpolation was performed for the values of the optical constants not listed in the databases or textbooks. In addition, or as an alternative, to the aforementioned layer materials, other layer materials could also be used for the antireflection coating 3, for example Ru, Mo, Ni, ZrN, SiC, ZrO$_2$, La, B, etc.

By way of example, the EUV mirror 1 described above can be used in a projection lens of an EUV lithography apparatus or in a system for inspecting EUV masks. If absorbing structures are applied to the EUV mirror 1 in the region of the EUV coating 5, said EUV mirror can also be used as an EUV mask for an EUV lithography apparatus.

Subsequently, a number of possibilities for the design of an optical arrangement 10, which, in the shown examples, is formed from the EUV mirror 1 from FIG. 1 and a device 11 for thermal manipulation of the EUV mirror 1, are described on the basis of FIG. 11 and FIGS. 12A, 12B. In order to undertake targeted spatially dependent thermal influencing of the optical surface 6 of the EUV mirror 1, the device 11 comprises a plurality of heating light sources 8 for producing heating radiation 7.

During operation, the EUV mirror 1 is heated due to the absorption of the EUV radiation 4 (cf. absorptivity $A_{EUV}$ in FIG. 2), which can lead to undesired figure changes on the optical surface 6. In order to dissipate the absorbed heat, the optical arrangement 10 shown in FIG. 11 additionally comprises an e.g. metallic cooling body 12 for cooling the EUV mirror 1, said cooling body extending over the whole rear side of the EUV mirror 1 and therebeyond. During operation of the EUV mirror 1 in an EUV lithography apparatus, a gas (for example with hydrogen $H_2$ as a main constituent) with a pressure of e.g. approximately $4 \times 10^{-2}$ mbar (fine vacuum) is situated between the EUV mirror 1 and the cooling body 12. By way of example, the EUV mirror 1 can be cooled equally by radiation and by thermal conduction by the gas.

It is advantageous to utilize the cooling body 12 for spatially resolved heating of the coating of the EUV mirror 1 through the substrate 2 (from the rear side). By way of example, this can be carried out by virtue of the heating light sources 8, e.g. in the form of LEDs or diode lasers, being integrated into the cooling body 12 or being attached to the cooling body 12. In the example shown in FIG. 11, the heating light sources 8 are attached to the side of the cooling body 12 facing the EUV mirror 1 in a grid-shaped or matrix-shaped arrangement (array), cf. the section of the cooling body 12 at the bottom of FIG. 11. By way of example, the heating light sources 8 can be positioned precisely on the cooling body 12 with the aid of an adjustment grid 13. The heating light sources 8 can comprise a suitable front-end optical unit (not shown here) for beam shaping and possibly for focusing the heating radiation 7. In order to be able to undertake a targeted spatially resolved thermal manipulation, and hence a desired figure change of the EUV mirror 1, each individual heating light source 8 can be set or regulated individually in terms of the radiation power or the heating power thereof.

As an alternative to attaching the heating light sources 8 directly on the cooling body 12, the heating radiation 7 can be fed to the cooling body 12 or the optical element 1 using a beam guidance device, e.g. in the form of an optical fibre cable 14. In this case, the heating light sources 8 can be positioned at a location separate from the cooling body 12, for example outside of a vacuum housing in which the EUV mirror 1 is housed. In the exemplary embodiment of the device 11 for thermal manipulation shown in FIG. 12A, the ends of the optical fibre cables 14 are attached to receptacle holes 15 of the cooling body 12 or are introduced into the latter. In the shown example, a front-end optical unit 16 is fastened to the emergence-side end of a respective optical fibre cable 14, which front-end optical unit is introduced into a corresponding receptacle hole 15 of the cooling body 12 and affixed there in order to radiate the heating radiation 7 in the direction of the rear side of the EUV mirror 1.

Figure 11:
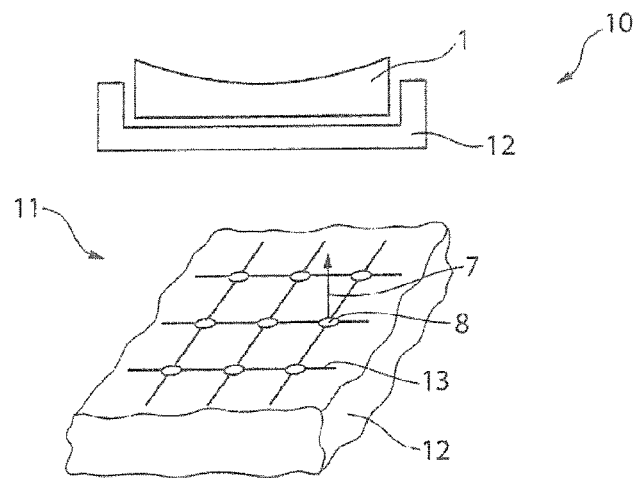
FIG. 11 shows a schematic illustration of an optical arrangement comprising an optical element in accordance with FIG. 1 and comprising a plurality of heating light sources attached to a cooling body.
Figure 12A:
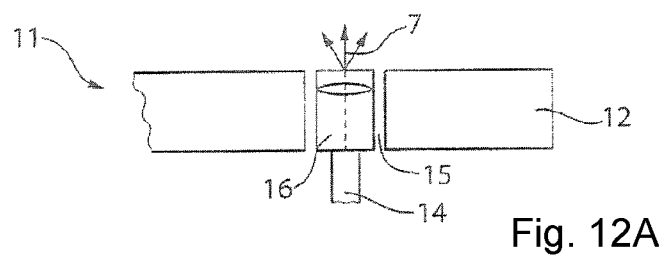
FIGS. 12A and 12B show schematic illustrations analogous to FIG. 11, in which the heating radiation is supplied to the EUV mirror via beam guidance devices in the form of optical fibres.
Figure 12B:
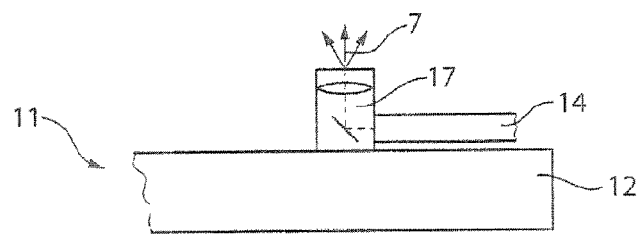

FIG. 12B shows an exemplary embodiment of the device 11, in which the optical fibre cables 14 are guided along the upper side of the cooling body 12, i.e. on the side facing the EUV mirror 1, and are incident there on a front-end optical unit for the optical fibre cable 14, which front-end optical unit is embodied as a deflection optical unit 17 in order to deflect the heating radiation 7 onto the rear side of the EUV mirror 1. The arrangement of the receptacle holes 15 or the deflection optical units 17 on the cooling body 12 can correspond to the grid-shaped arrangement shown in FIG. 11. It is understood that typically precisely one heating light source 8 (not shown in FIGS. 12A, 12B) with an adjustable heating power is assigned to each optical fibre cable 14.

Figure 13:
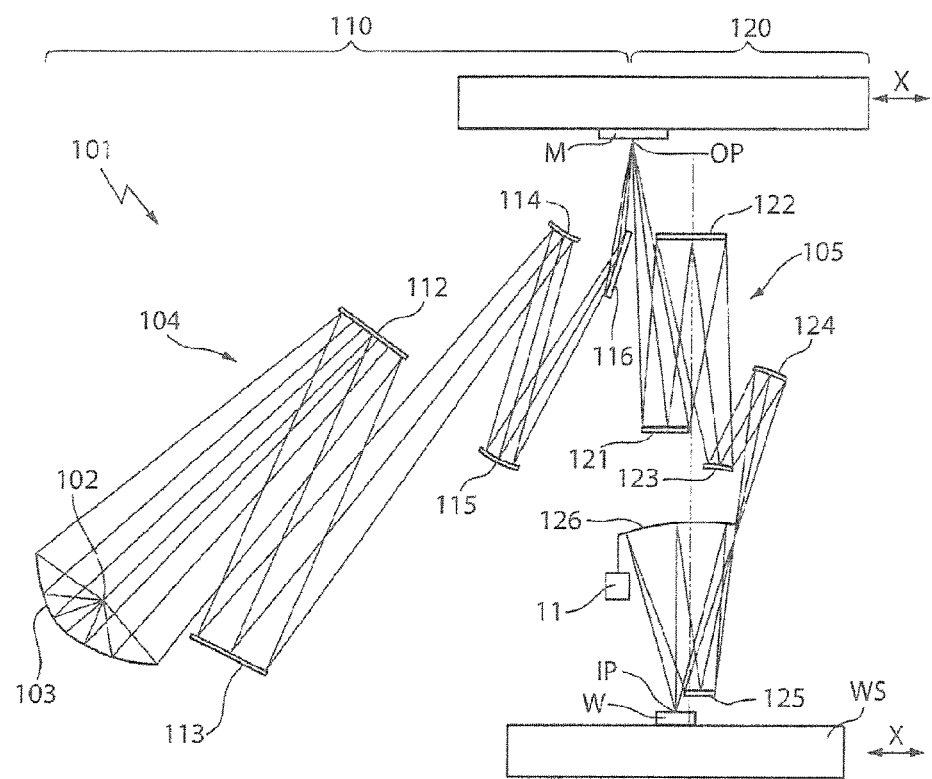
FIG. 13 shows a schematic illustration of an EUV lithography apparatus.

FIG. 13 very schematically shows an optical arrangement in the form of an EUV lithography apparatus 101, in which the arrangements from FIG. 11 or from FIGS. 12A, 12B can be integrated. The EUV lithography apparatus 101 comprises an EUV light source 102 for producing EUV radiation, which has a high energy density in an EUV wavelength range below 50 nm, in particular between approximately 5 nm and approximately 15 nm. By way of example, the EUV light source 102 can be embodied in the form of a plasma light source for producing a laser-induced plasma or as a synchrotron radiation source. Particularly in the first case it is possible, as shown in FIG. 13, to use a collector mirror 103 in order to focus the EUV radiation from the EUV light source 102 to form an illumination beam 104 and thus to further increase the energy density. The illumination beam 104 serves for illuminating a structured object M via an illumination system 110 which, in the present example, comprises five reflective optical elements 112 to 116 (mirrors).

By way of example, the structured object M can be a reflective mask which comprises reflective and non-reflective or at least less strongly reflective regions for producing at least one structure at the object M. Alternatively, the structured object M can be a plurality of micromirrors which are arranged in a one or more dimensional arrangement and which are possibly movable about at least one axis in order to set the angle of incidence of the EUV radiation 104 on the respective mirror.

The structured object M reflects part of the illumination beam 104 and forms a projection beam path 105 which carries information relating to the structure of the structured object M and which is radiated into a projection lens 120, said projection lens producing an image of the structured object M or of a respective portion thereof on a substrate W. The substrate W, for example a wafer, comprises a semiconductor material, e.g. silicon, and it is arranged in a holder which is also referred to as wafer stage WS.

In the present example, the projection lens 120 comprises six reflective optical elements 121 to 126 (mirrors) in order to produce an image on the wafer W of the structure present on the structured object M. The number of mirrors in a projection lens 120 is typically between four and eight, but use can possibly also be made of only two mirrors.

In order to achieve a high imaging quality when imaging a respective object point OP of the structured object M on a respective image point IP on the wafer W, very high demands are to be placed on the surface form of the mirrors 121 to 126 and the position or the alignment of the mirrors 121 to 126 in relation to one another and relative to the object M and the substrate W also requires a precision in the nanometer range. Each one of the EUV mirrors 121 to 126 can be embodied as described above in conjunction with FIG. 1 to FIG. 10 and each EUV mirror can be assigned a dedicated device 11 for thermal manipulation which, for example, can be embodied as described in FIG. 11 or in FIGS. 12A, 12B.

In the projection lens 120 depicted in FIG. 13, the sixth mirror 126 is embodied as a thermally actuatable EUV mirror 1 in accordance with FIG. 1 and the latter is assigned a device 11 for thermal manipulation which is embodied to individually actuate the heating light sources 8 (not shown in FIG. 13) in order to set a desired spatially dependent temperature distribution and therefore a spatially dependent figure change of the optical surface 6 (cf. FIG. 1) of the sixth EUV mirror 126.

Additionally, one or more sensors for capturing the temperature of the EUV mirror 126 or of the optical surface 6 and/or for capturing the temperature of the substrate 2 of the EUV mirror 126 can be arranged in the EUV lithography apparatus 101 so that the device 11 for thermal manipulation can perform a regulation of the spatially dependent heat influx into the EUV mirror 126 in order to perform a desired spatially dependent and time-dependent figure change, for example for correcting wavefront errors at the EUV mirror 126.

Figure 14A:
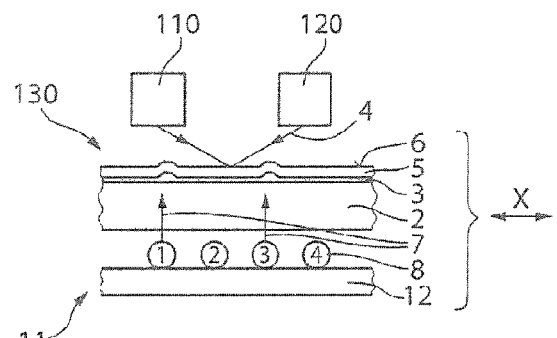
FIGS. 14A and 14B show schematic illustrations of an EUV lithography apparatus comprising an EUV mask which is displaceable along a scanning direction.
Figure 14B:
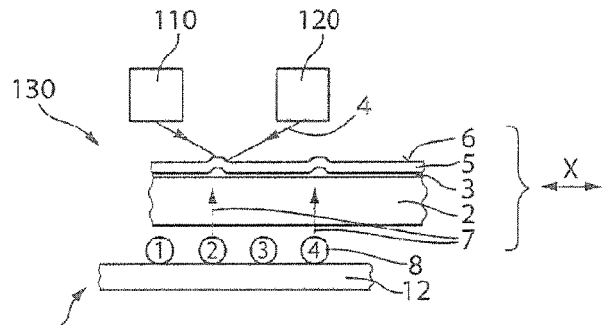

FIGS. 14A and 14B show, in a much simplified manner, the EUV lithography apparatus 101 from FIG. 13 comprising the illumination system 110 and the projection lens 120, and also the structured object M, arranged therebetween, in the form of an EUV mask 130 on which the EUV radiation 4 is incident. The EUV mask 130 is designed like the EUV mirror shown in FIG. 1, i.e. it has an EUV coating 5 and an antireflection coating 3 which is embodied to suppress heating radiation 7 at a specific heating wavelength $\lambda_H$ or in a specific heating wavelength range. Additionally, portions (not shown) in the form of the absorbing material are formed on the upper side of the EUV coating 5, which portions do not, or hardly, reflect the incident EUV radiation 4. In the shown example, the device 11 for thermal manipulation is embodied as shown in FIG. 11, i.e. the heating light sources 8 are attached to the cooling body 12 in a grid-shaped arrangement, wherein merely four heating light sources 8 are shown in FIGS. 14A, 14B in an exemplary manner.

The EUV lithography apparatus shown in FIGS. 14A, 14B is a so-called wafer scanner, in which the EUV mask 130 is displaced in a scanning direction X during the exposure, wherein, simultaneously, the substrate W is moved in, or counter to, the scanning direction X (cf. FIG. 13).

In the example shown in FIG. 14A, the cooling body 12 and hence the heating light sources 8 are displaced together with the EUV mask 130 in the scanning direction X, and so the relative position of the heating light sources 8 relative to the EUV mask 130 remains unchanged during the movement in the scanning direction X. Accordingly, the heating light sources 8 of the device 11 for producing a desired local figure change with the heating radiation 7, which is depicted by two bulges in the region of the first and the third heating light source 8, can be actuated as if the EUV mask 130 were arranged in a stationary manner.

In the example shown in FIG. 14B, only the EUV mask 130 is displaced in the scanning direction X, while the cooling body 12 comprising the heating light sources 8 remains stationary. In this case, it is necessary to take into account the movement of the EUV mask 130 when actuating the heating light sources 8 for producing a desired figure change of the EUV mask 130. What can be identified in FIG. 14B is that it is necessary for the heating radiation 7 to be produced by the second and the fourth heating light source 8 and not by the first and the third heating light source 8 in order to produce the same figure change as in FIG. 14A. What is used in the embodiment shown in FIG. 14B is that the heating light sources 8 or the heating power thereof is/are individually controllable or regulable and that, during the movement in the scanning direction X, the speed or the acceleration of the EUV mask 130, and hence the position of the EUV mask 130, is known or can be determined using suitable sensors.

Figure 15:
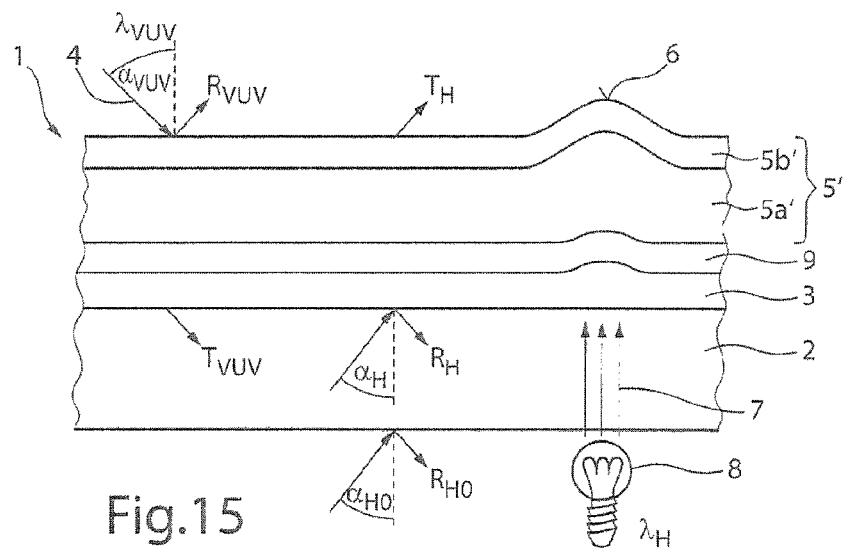
FIG. 15 shows a schematic illustration of a mirror comprising a coating which reflects VUV radiation and comprising an antireflection coating for heating radiation which is fed to the mirror from the rear side of a mirror substrate.

FIG. 15 shows a mirror 1 which differs from the mirror 1 shown in FIG. 1 in that it comprises a reflective coating 5' which is embodied for reflecting VUV radiation 4, i.e. which coating has a maximum reflectivity $R_{VUV}$ for radiation with a used wavelength $\lambda_{VUV}$ in the range between approximately 150 nm and approximately 260 nm. In the shown example, the reflective coating 5' is optimized for reflecting VUV radiation 4 at a used wavelength $\lambda_{VUV}$ of approximately 193 nm. In the shown example, the reflective coating 5' comprises a metallic layer 5a', on which a dielectric coating 5b' comprising a plurality of individual layers has been applied for increasing the reflectivity of the metallic layer 5a'

Otherwise, the VUV mirror 1 substantially has a design as described in conjunction with FIG. 1, i.e. it comprises a substrate 2 made of amorphous fused quartz $SiO_2$ or of ULE®, through which heating radiation 7 produced by a heating light source 8 passes. In the shown example, the heating wavelength $\lambda_H$ lies at more than 400 nm and generally at no more than 900 nm. As described above in conjunction with FIG. 3 to FIG. 9, the antireflection coating 3 can be optimized for a specific heating wavelength $\lambda_H$ or for a specific heating wavelength range, wherein a suitable antireflection coating 3 is determined taking into account the layer composition of the VUV coating 5'.

If the VUV coating 5' should not have a sufficient absorption for the heating radiation 7 and if the thickness d of the antireflection coating 3 of less than 500 nm or of less than approximately 100 nm should not be sufficient for completely absorbing the (possibly long-wavelength) heating radiation 7, an absorbing layer 9 can be applied between the VUV coating 5' and the antireflection coating 3, which absorbing layer can for example include a metallic material, e.g. nickel (Ni), or else metalloids, such as e.g. silicon (Si), or other materials which have a sufficient absorption for the heating radiation 7.

Figure 16:
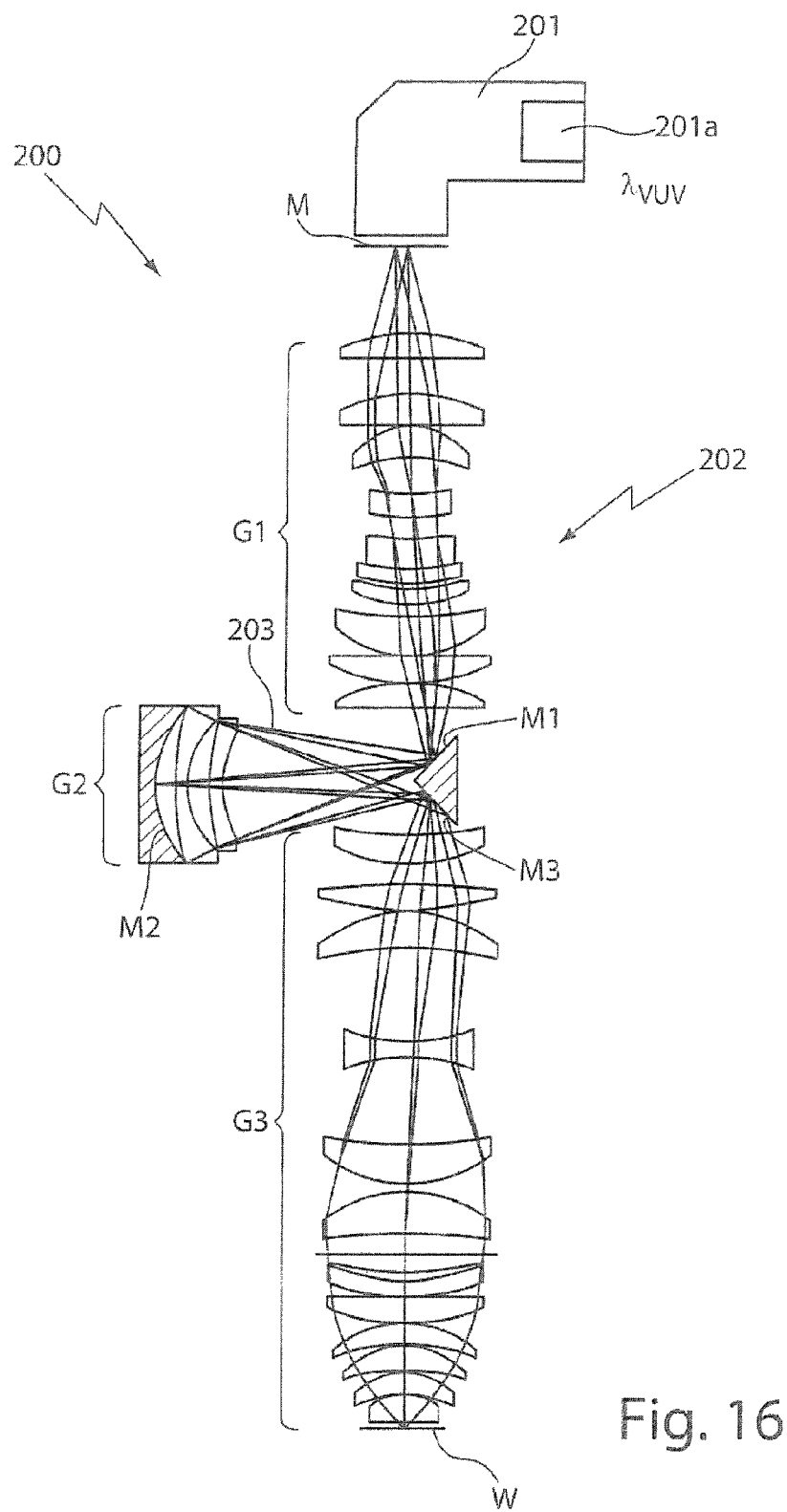
FIG. 16 shows a schematic illustration of a projection lens for VUV lithography comprising a mirror in accordance with FIG. 15.

By way of example, the mirror 1 shown in FIG. 15 can be used in a VUV lithography apparatus 200, as is depicted in FIG. 16 in an exemplary manner. The VUV lithography apparatus 200 comprises an illumination system 201 comprising a VUV light source 201a. The illumination system 201 homogeneously illuminates a mask M arranged in a reticle plane. A subsequent projection lens 202 images a structure on the mask M onto a photosensitive substrate W, which is arranged in a wafer plane. The projection lens 202 is a catadioptric system comprising a concave reflector mirror M2, which is arranged in a beam path 203 between a first and a second deflection mirror M1, M3.

The projection lens 202 furthermore comprises three image shaping systems G1 to G3, which respectively comprise a plurality of optical elements (lens elements), the arrangement and function of which lies beyond the scope of the subject matter of the present invention and will therefore not be described here; in respect of a detailed description, reference is made to e.g. WO 2004/019128. In the following, only the general properties of the image shaping systems G1 to G3 are illustrated.

The first dioptric image shaping system G1 only comprises transmitting optical elements and images the pattern situated on the mask M on a first intermediate image (not shown), which is situated in front of the first deflection mirror M1. The second, catadioptric image shaping system G2 comprises the first deflection mirror M1 and the catadioptric part of the projection lens 202, and it is embodied to shape a second intermediate image from the first intermediate image. The second intermediate image is imaged by the third, catadioptric image shaping system G3 on the wafer plane with the substrate W via the second deflection mirror M3. A person skilled in the art will recognize that each one of the image shaping systems comprises a pupil plane, wherein the concave reflector mirror M2 is arranged in the pupil plane of the second image shaping system G2.

Both the first and the second deflection mirror M1, M3, as well as the concave reflector mirror M2, can be embodied in the manner shown above in conjunction with FIG. 15 and can be provided with a device 11 for thermal manipulation.

Particularly the concave reflector mirror M2, which is arranged in the region of a pupil plane of the projection lens 202, can be utilized particularly advantageously for correcting higher-order wavefront errors. Further examples of projection lenses, in which the VUV mirror 1 described above can be utilized, are described in e.g. U.S. Pat. No. 6,665,126 for a catadioptric design with one intermediate image and two deflection mirrors and in WO 2005/069055 for a catadioptric design with two intermediate images.

It is understood that the EUV mirror 1 and the VUV mirror 1 described above can also be utilized advantageously in illumination systems of projection exposure apparatuses or in other optical systems for the EUV wavelength range or the VUV wavelength range in order to produce a desired surface form or figure of the optical surface 6 by a thermal manipulation.

What is claimed is:

1. An optical arrangement comprising at least one optical element and at least one thermal manipulation device, wherein the optical element comprises:
    a substrate, an overall coating applied to the substrate, the overall coating comprising:
        a reflective multi-layer coating configured to reflect radiation having a wavelength in an EUV wavelength range, and
        an antireflection coating arranged between the substrate and the reflective multi-layer coating and configured to suppress reflection of heating radiation having a heating wavelength that differs from the wavelength in the EUV wavelength range, and
    wherein the thermal manipulation device comprises at least one heating light source configured to produce the heating radiation,
    wherein the thermal manipulation device is configured to radiate the heating radiation through the substrate and onto the antireflection coating,
    wherein the antireflective coating is matched to properties of the substrate such that the antireflective coating has an antireflective effect on the heating radiation incident on the antireflective coating through the substrate, and
    wherein the suppression of the reflection of the heating radiation by the antireflection coating is maximal for a heating wavelength of more than 400 nm and less than 900 nm.

2. The optical arrangement according to claim 1, wherein the overall coating applied to the substrate is configured to completely absorb the heating radiation.

3. The optical arrangement according to claim 1, wherein the antireflection coating is configured to at least partly absorb the heating radiation.

4. The optical arrangement according to claim 1, wherein the overall coating further comprises an absorbing coating configured to at least partly absorb the heating radiation.

5. The optical arrangement according to claim 4, wherein the absorbing coating is arranged adjacent to the antireflection coating.

6. The optical arrangement according to claim 4, wherein the absorbing coating is arranged between the antireflection coating and the reflective multi-layer coating.

7. The optical arrangement according to claim 4, wherein the absorbing coating is a multi-layer coating.

8. The optical arrangement according to claim 4, wherein the absorbing coating includes at least one metallic material.

9. The optical arrangement according to claim 1, wherein the substrate is formed from a material which is at least partly transparent to the heating radiation.

10. The optical arrangement according to claim 1, wherein the antireflection coating includes at least one material selected from the group comprising: $B_4C$, Si, $Si_3N_4$, C, Ru, Mo, Ni, ZrN, SiC, $ZrO_2$, La, B.

11. The optical arrangement according to claim 1, wherein the antireflection coating has a thickness of less than 500 nm.

12. The optical arrangement according to claim 1, wherein a reflectivity of the reflective multi-layer coating is maximal for extreme ultraviolet (EUV) radiation with a wavelength of between 1 nm and 35 nm.

13. The optical arrangement according to claim 12, configured as an EUV mirror or as an EUV mask.

14. The optical arrangement according to claim 1, wherein a reflectivity of the reflective multi-layer coating is maximal for very ultraviolet (VUV) radiation with a wavelength of between 150 nm and 260 nm.

15. The optical arrangement according to claim 14, wherein the reflective multi-layer coating comprises at least one layer configured to at least partly absorb the heating radiation at the heating wavelength.

16. The optical arrangement according to claim 1, wherein the thermal manipulation device comprises a plurality of heating light sources in a grid-shaped arrangement.

17. The optical arrangement according to claim 1, wherein the at least one heating light source is attached to a cooling body configured to cool the optical element.

18. The optical arrangement according to claim 1, configured as an EUV lithography apparatus.

19. The optical arrangement according to claim 17, wherein the optical element is configured as an EUV mask displaceable in a movement direction.

20. The optical arrangement according to claim 19, wherein the at least one heating light source configured to output the heating radiation onto the EUV mask, a deflection device configured to deflect the heating radiation onto the EUV mask and/or a beam guidance device configured to guide the heating radiation onto the EUV mask is/are mounted to be stationary with respect to the EUV mask when the EUV mask is displaced in the movement direction.

21. The optical arrangement according to claim 1, configured as a catadioptric projection lens for VUV microlithography.

22. The optical arrangement according to claim 21, wherein the optical element is arranged in a region of a pupil plane of the catadioptric projection lens.

23. The optical arrangement according to claim 1, further comprising a deflection device configured to deflect the heating radiation from the heating light source onto the optical element, wherein the deflection device is attached to a cooling body configured to cool the optical element.

24. The optical arrangement according to claim 1, further comprising a beam guidance device configured to guide the heating radiation from the heating light source onto the optical element, wherein the beam guidance device is attached to a cooling body configured to cool the optical element.

* * * * *

UNITED STATES PATENT AND TRADEMARK OFFICE
CERTIFICATE OF CORRECTION

PATENT NO. : 10,474,036 B2
APPLICATION NO. : 15/257349
DATED : November 12, 2019
INVENTOR(S) : Hans-Jochen Paul et al.

Page 1 of 1

It is certified that error appears in the above-identified patent and that said Letters Patent is hereby corrected as shown below:

In the Specification

Column 12, Line 63, Delete "$R_H T_H A_H = 1$" and insert -- $R_H + T_H + A_H = 1$ --, therefor.

Column 16, Line 15, After "coatings" insert -- . --.

Column 20, Line 4, After "5a'" insert -- . --.

Signed and Sealed this
Eighth Day of September, 2020

Andrei Iancu
*Director of the United States Patent and Trademark Office*